United States Patent [19]
Chu et al.

[11] Patent Number: 5,908,320
[45] Date of Patent: *Jun. 1, 1999

[54] HIGH SELECTIVITY BPSG:TISI₂ CONTACT ETCH PROCESS

[75] Inventors: Dinh Lau Chu, Milpitas; Donna Lee Alterio, Mountain View, both of Calif.

[73] Assignee: Lam Research Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/672,462

[22] Filed: Jun. 26, 1996

[51] Int. Cl.⁶ .................................. H01L 21/3065
[52] U.S. Cl. .................... 438/743; 438/738; 438/723
[58] Field of Search .................... 156/643.1, 654.1, 156/655.1, 657.1; 438/693, 723, 721, 738, 740, 743; 216/67, 72, 80

[56] References Cited

U.S. PATENT DOCUMENTS

| | | | |
|---|---|---|---|
| 5,556,501 | 9/1996 | Collins et al. | 156/345 |
| 5,589,413 | 12/1996 | Sung et al. | 437/43 |
| 5,611,888 | 3/1997 | Bosch et al. | 156/643.1 |
| 5,626,716 | 5/1997 | Bosch et al. | 438/723 |

OTHER PUBLICATIONS

Computer printout of REGISTRY database search of "SUVA.", Jul. 1997.

Computer printout of USPATFULL database search of "SUVA.", Jul. 1997.

*Primary Examiner*—Marion McCamish
*Assistant Examiner*—Cheryl Juska
*Attorney, Agent, or Firm*—Beyer & Weaver, LLP

[57] ABSTRACT

A method for etching through a selected portion of a Borophosphosilicate Glass (BPSG) layer of the silicon wafer layer stack to a Titanium Silicide ($TiSi_2$) layer in a plasma processing chamber is disclosed. The method includes the step of etching through the BPSG layer using an etchant source gas that includes Ne, $CHF_3$, CO and $C_4F_8$. Additional process parameters are disclosed for obtaining a high BPSG:$TiSi_2$ selectivity etch with commercially advantageous BPSG etch rates.

17 Claims, 2 Drawing Sheets

HIGH SELECTIVITY BPSG:TISI$_2$ CONTACT ETCH PROCESS

BACKGROUND OF THE INVENTION

The present invention relates to the plasma etching of a silicon wafer. More particularly, the present invention relates to methods for etching through a Borophosphosilicate Glass (BPSG) layer of a silicon wafer layer stack in the manufacture of an integrated circuit (IC).

In semiconductor IC fabrication, devices such as component transistors may be formed on a semiconductor wafer or substrate, which is typically made of silicon. Successive layers of various materials may be deposited onto the wafer or substrate to form a layer stack. With reference to a silicon wafer layer stack 100 illustrated in FIG. 1A, for example, a TiSi$_2$ layer 102 may be formed above a silicon wafer 104. The TiSi$_2$ layer may have many functions, including functioning as an interconnecting layer. When used as an interconnecting layer, the TiSi$_2$ layer may be patterned and etched in a conventional manner to form interconnect lines for coupling various devices of the IC together to form the desired circuit. A BPSG layer 106 may be formed over the TiSi$_2$ layer to act as a dielectric layer.

It should be noted that the layer stack of FIG. 1A is shown for illustration purposes only and other additional layers, which have not been described, may be present above and below the TiSi$_2$ layer and the BPSG layer. These other layers may be used to provide, for example, additional interconnecting layers or layers from which components may be formed.

In order to electrically interconnect portions of the aforementioned TiSi$_2$ layer to other layers and/or devices, contacts may be formed which extend through the BPSG dielectric layer. These contacts may be formed by etching contact openings through the BPSG layer using a suitable photoresist technique to pattern and mask the BPSG layer. The photoresist layer represents a layer of conventional photoresist material, which is capable of being patterned for etching, e.g., through exposure to ultra-violet rays. This patterning process removes portions of the photoresist layer and exposes certain portions of the BPSG layer for etching.

To illustrate, FIG. 1A shows portions of an overlaying photoresist (PR) layer that remain after the patterning step, including portions 108a and 108b atop BPSG layer 106. An opening through the photoresist mask is indicated by open region 110 in FIG. 1A. Through the photoresist mask, the BPSG layer may then be etched to form the contact openings. To actually make the electrical contact, the contact opening through BPSG layer 106 may be filled in a conventional manner with an appropriate electrically conductive material such as aluminum, titanium, various aluminum and titanium alloys, and the like.

Each of the described layers of layer stack 100 is readily recognizable to those skilled in the art and may be formed using any of a number of suitable and known deposition processes. These processes may include, for example, chemical vapor deposition (CVD), plasma-enhanced chemical vapor deposition (PECVD), and physical vapor deposition (PVD) such as sputtering.

In the design of a BPSG etch process, e.g., to provide the aforementioned contact openings through the BPSG layer, many considerations must be taken into account. Among these considerations is etch rate selectivity, i.e., how well an etch process discriminates between the target BPSG layer and other layers from which material removal is undesired. To provide a reliable and commercially advantageous etching process, etching regimes which exhibit a high etch rate selectivity between the different layers of the layer stack are desirable. Manufacturers measure the etch rate selectivity, or simply selectivity, by the ratio of the etch rate of a particular etch process through a particular layer compared to the etch rate of that etch process through another layer of the layer stack. In the case of etching through a BPSG layer down to a TiSi$_2$ layer, a high BPSG to TiSi$_2$ selectivity is usually desired.

Another consideration in the design of an etch process relates to etch rate uniformity, i.e., how uniform an etch process is at different regions of the wafer. If the etch rate uniformity is poor, for example, the etch rate in the central region of the wafer may be much faster than the etch rate in the peripheral regions of the wafer. One common approach measures the depth of the etch at various locations on the wafer, e.g., 17 in one case, and calculates a percentage variation based on these measurements by, for example, taking the maximum etch rate minus the minimum etch rate and dividing by two times the average etch rate.

Another consideration relates to etch rate loading. Etch rate loading has recently gained more attention since modern IC circuits are scaled with increasingly narrower design rules to achieve greater circuit density. As a result, the feature sizes such as the width of the interconnect lines and the width of contacts formed to interconnect the features have steadily decreased. As the feature sizes shrink, it becomes increasingly difficult to achieve a uniform etch rate both in the region where the features are closely spaced, i.e., the narrow spacings, and in the region where there are open fields, i.e., the wider spacings.

For some etch processes, the etch rate in the narrow spacings may be slower than that in the wider spacings or open field regions. This phenomenon, referred herein as the loading in etch rates, may be a consequence of microloading and aspect ratio-dependent etching (ARDE). Microloading or RIE lag refers primarily to the situation wherein the etch rate is reduced in smaller contacts or trenches when compared to larger contacts or trenches in the same location on the wafer. It can also be said that the aspect ratio of large or small contacts or trenches are different and therefore the etch exhibits ARDE. The loading in etch rates causes trenches to be formed in the layer stack at different rates. This etch rate loading tends to become more severe when opening widths fall below about 0.8 microns, and especially when opening widths fall below about 0.5 microns. As a result of the etch rate variations, by the time the desired etching is complete in areas having a slow etch rate (e.g., in the narrower openings), overetching (e.g., the inadvertent removal of materials from underlying layers) may have already occurred in areas having a higher etch rate (e.g., the open field regions or larger openings).

Another consideration relates to the profile angle of the etch. Profile angles has become a more significant issue as the feature sizes on the wafer shrink. Profile angle refers to the angle the sidewalls of an etch opening forms with the horizontal plane of the wafer. Generally an anisotropic or vertical sidewall (i.e., a profile angle of 90 degrees) is desired. However, different process chemistries and parameters may result in, for example, the undercutting of the sidewalls (i.e., profile angles greater than 90 degrees) or sloped sidewalls (i.e., profile angles less than 90 degrees). It is believed that the sloped sidewalls or low profile angles may be caused by an excessive polymer buildup along the sidewalls during the etching process, which prevents the proper vertical etching of the sidewall.

For illustration purposes, the phenomenon of etch rate loading and profile angle will be described with reference to FIG. 1B, which illustrates the same layer stack shown in FIG. 1A after the completion of a hypothetical BPSG etch process. Etch rate loading, as mentioned, refers to the difference in the rate of etching in regions of the wafer having dense features (i.e., narrow openings) compared to open field regions. To determine the etch rate loading for a particular etching regime, a partial etch may be performed. Referring to FIG. 1B, dashed lines 114 and 116 indicate the depth to which the layer stack is etched by the partial etch. Due to the etch rate loading phenomenon, the depth $D_2$ of the etch within narrow openings, illustrated by opening 118, is not as deep as depth $D_1$ in more open regions, illustrated by open region 120. Etch rate loading may be quantified by the equation $[(D_1-D_2)/D_1 \times 100]$ to express the etch rate loading as a percentage of the etch depth. With respect to profile angles, line 122 in FIG. 1B represents a sidewall formed in opening 118 which exhibits a profile angle of less than the desired 90 degree vertical sidewall (indicated by the dashed lines in FIG. 1B)

In the prior art, there exist many BPSG etch processes. However, these processes were typically optimized for a particular set of requirements, e.g., high BPSG to polysilicon or for different geometries. As technology changes, however, IC chip manufacturers continually search for ways to improve BPSG etch results. In view of the foregoing, what is desired are improved methods and apparatus for etching a BPSG layer, particularly for etching down through the BPSG layer to a $TiSi_2$ layer in a wafer layer stack.

SUMMARY OF THE INVENTION

As will be described in more detail hereinafter, the invention relates to a method for providing a high Borophosphosilicate Glass (BPSG) to Titanium Silicide ($TiSi_2$) selectivity in the etching of a selected portion of a BPSG layer of the silicon wafer layer stack through to a $TiSi_2$ layer of the wafer's layer stack in a plasma processing chamber. The method includes etching through the BPSG layer using an etchant source gas that includes Neon (Ne), Freon ($CHF_3$), and at least one selectivity enhancing chemical. Preferably the selectivity enhancing chemicals include carbon monoxide (CO) and/or $C_4F_8$.

In a preferred embodiment which includes the use of CO and $C_4F_8$ as selectivity enhancing chemicals, the flow rate for the $CHF_3$ is within the range of about 10 standard cubic centimeters per minute (sccm) to about 40 sccm; the Ne:$CHF_3$ flow ratio is about 10:1; the CO:$CHF_3$ flow ratio is about 3:2; and the CO:$C_4F_8$ flow ratio is about 6:1.

In another embodiment, a method of etching a contact opening during the manufacturing of an integrated circuit having components formed on a semiconductor wafer die is disclosed. The die has thereon etched layers of a layer stack and the contact opening is formed through a BPSG layer of the layer stack which is positioned above a $TiSi_2$ layer of the layer stack. The method includes the step of etching a contact opening substantially through a selected portion of the BPSG layer of the layer stack to the $TiSi_2$ layer of the layer stack with an etchant source gas that comprises Ne, $CHF_3$, and at least one selectivity enhancing chemical.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

An invention is described for providing, in the etching a BPSG layer of a layer stack through to an underlying $TiSi_2$ layer in a plasma processing chamber, advantageous etch results, including a high BPSG to $TiSi_2$ selectivity, and a high BPSG etch rate. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

The inventive etch technique may be performed in any known plasma processing apparatuses such as those adapted for dry etching, plasma etching, reactive ion etching (REI), magnetically enhanced reactive ion etching (MERIE), electron cyclotron resonance (ECR), or the like. In a typical plasma processing chamber adapted for dry etching, the wafer is treated with plasma. The chamber includes an inlet port through which etchant source gases are supplied to the chamber interior. A suitable RF energy source is applied to electrodes associated with the chamber to induce a plasma from the etchant source gases. The energy itself may be coupled inductively or capacitively to sustain the plasma, as is known. Species are then formed from the etchant source gas to react with the layer stack and etch away at the plasma-contacting regions of the wafer layer stack. The by-products, which may be volatile, are then exhausted through an exit port.

It is contemplated that the invention may be practiced in any of the above mentioned reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and transformer coupled plasma. These processing systems, among others, are readily available commercially.

Figure 2:
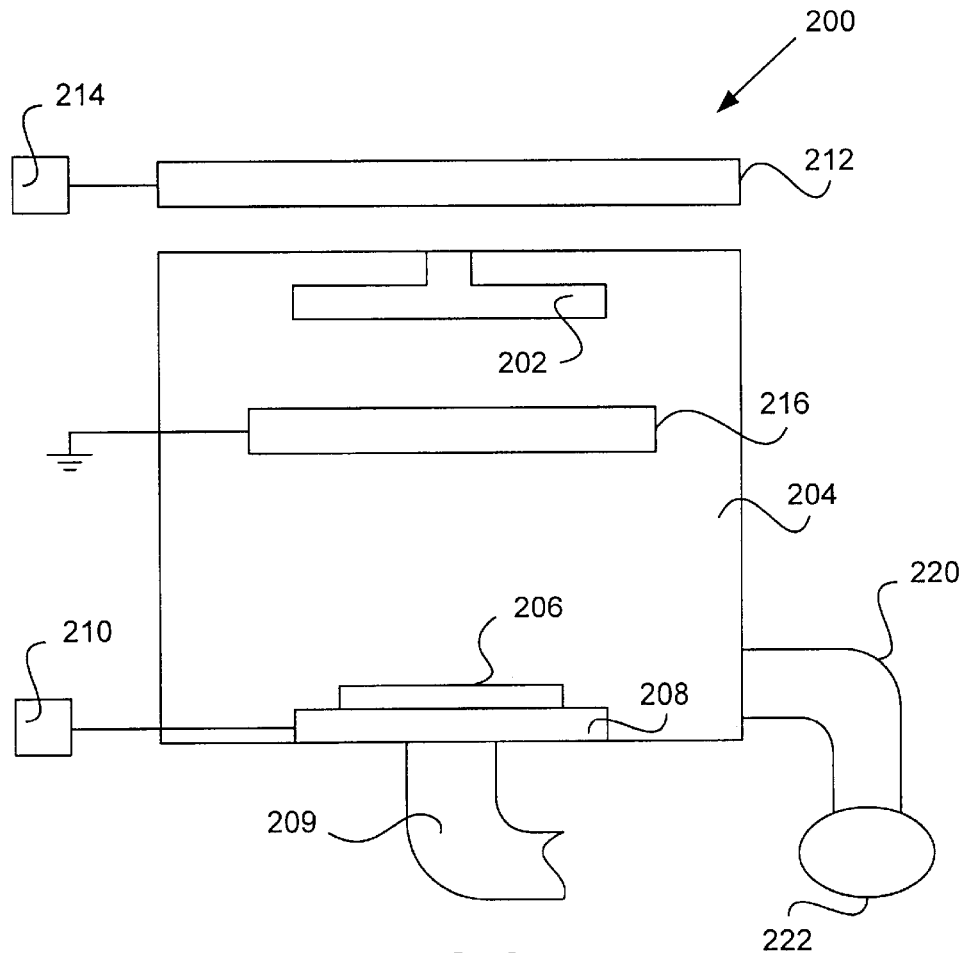
FIG. 2 illustrates, in accordance with one aspect of the present invention, a simplified schematic diagram of a plasma reactor that may be suitably employed with the inventive etch technique.

In a preferred embodiment, the present invention is employed in an Oxide 9500™ plasma etch system, available from Lam Research Corporation of Fremont, Calif., although, as mentioned above, any conventional or suitable plasma processing systems may well be employed. For illustration purposes, FIG. 2 depicts a simplified schematic of an Oxide 9500™ plasma etcher 200. Generally, reactor 200 may include a shower head 202, which preferably includes a plurality of holes for releasing gaseous source materials (i.e., the etchant source gases) into an RF-induced region within plasma chamber 204. The gaseous source materials may also be released in other manners, e.g., from ports built into the walls of the chamber itself.

A wafer 206 may be introduced into chamber 204 and disposed on a chuck 208, which may act as an electrode when biased by a radio frequency (RF) generator 210. Wafer 206 may be clamped to chuck 208 using a variety of methods, including electrostatic forces or by manual clamps. Helium cooling gas may be introduced under pressure through a port 209 to the region between chuck 208 and wafer 206 to act as a heat transfer medium for accurately controlling the wafer's temperature during processing, thereby ensuring uniform and repeatable etching results.

Figure 1A:
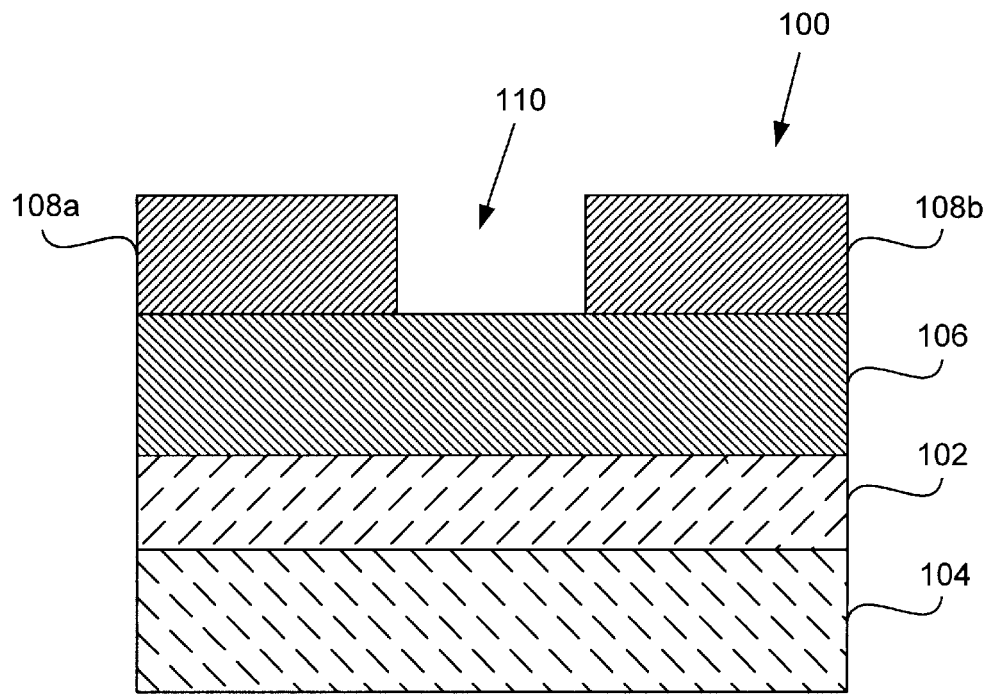
FIG. 1A illustrates a cross-sectional view of a layer stack representing the layers that may be formed during the fabrication of a semiconductor IC.
Figure 1B:
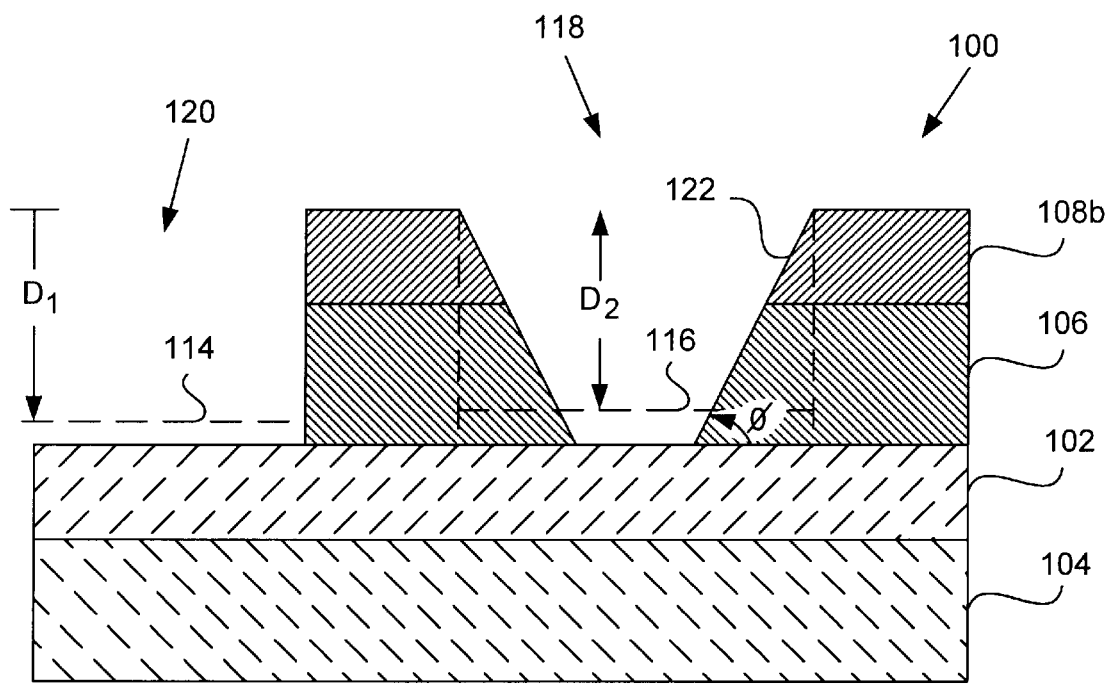
FIG. 1B illustrates a cross-sectional view of the layer stack of FIG. 1A after a contact opening has been etched through a BPSG layer of the layer stack.

A second electrode 212 may be disposed above chamber 204 and may take the form of a capacitive plate electrode in the example of FIG. 2. Electrode 212 may be energized by a RF generator 214 via a matching network (conventional and not shown in FIG. 1). A third electrode 216 may be positioned within chamber 204 in the region between electrode 208 and electrode 210. In a preferred embodiment, third electrode 216 is grounded and only RF generator 210, through electrode chuck 208, is employed to strike a plasma from the etchant source gas within chamber 204 in order to etch wafer 206.

During plasma etching, the pressure within chamber 204 is preferably kept low, e.g., by withdrawing gas through an exhaust port 220. In the example shown, a pump 222 is connected to exhaust port 220 for the purpose of removing gas from chamber 204. Preferably, the system is capable of maintaining a pressure as low as about 20 mTorr when the total input gas flow rate is about 150 standard cubic centimeters per minute (sccm).

Figure 3:
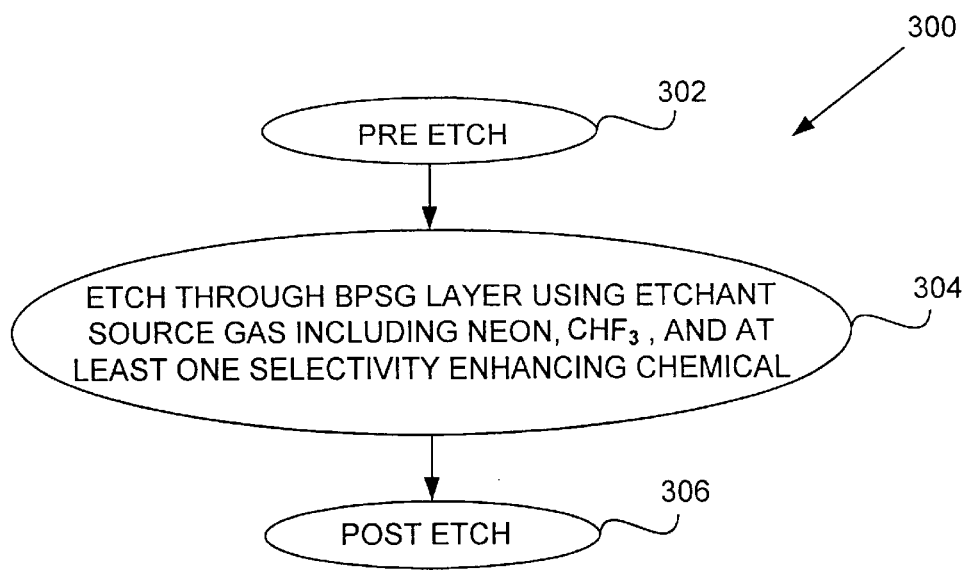
FIG. 3 illustrates a flow chart showing the steps involved in the inventive etch process in accordance with one embodiment of the present invention.

FIG. 3 shows, in accordance with one aspect of the present invention, the steps involved in the inventive etch process. In step 302, a wafer is prepared for etching in a conventional pre-etch step. The pre-etch step may include, for example, clamping the wafer onto the chuck, stabilizing the pressure within the plasma processing chamber, and introducing helium cooling gas to the wafer backside to facilitate heat transfer between the wafer and the chuck.

In step 304, the BPSG layer of the wafer is etched using the inventive etch parameters. The etchant source gas employed in this step may include Ne, $CHF_3$, and one or more selectivity enhancing chemicals, such as CO and $C_4F_8$. Preferably, portions of the BPSG layer are substantially etched by the inventive etch process through to the underlying $TiSi_2$ layer.

In step 306, the wafer may undergo additional processing steps to fabricate the desired components as well as post-etch processing steps that are conventional in nature. Thereafter, the finished wafer may be cut into dies, which may then be made into IC chips. The resulting IC chip, may then be incorporated in an electronic device such as any of the well known commercial or consumer electronic devices, including computers.

As mentioned above, the inventive etch process employs an etchant source gas which includes Ne, $CHF_3$, and at least one selectivity enhancing chemical to etch through a BPSG layer of a layer stack down to a $TiSi_2$ layer. Preferably the selectivity enhancing chemicals include CO and $C_4F_8$. It is believed that the $CHF_3$ acts as the primary etchant gas. Further, it is believe that the neon, in addition to its role as a diluent, also advantageously enhances the polymer formation process.

It has been found that the BPSG layer etch rate, the BPSG:$TiSi_2$ selectivity, the profile angle, the uniformity, and the etch rate loading achieved using the inventive etch method are well within commercially desirable ranges. For example, the uniformity and etch rate loading have been found to be, in some sample runs, less than about (+/−) 5%. Further, the profile angle has been found to be at least about 85 degrees to vertical (i.e., 90 degrees). It should be kept in mind, however, that specific process results achieved with the inventive etch method may be dependent on the deposition conditions of the BPSG layer, the specific BPSG composition, the type and geometry of the reactor, and the specific process parameters.

In general, for example, the BPSG etch rate may depend on the particular volumetric flow ratio of the neon and $CHF_3$ gases, as well as the total gas flow, the reactor chamber pressure, and the power supplied to the electrode (i.e., lower electrode/chuck 208 in FIG. 2). By way of example, in a plasma reactor configuration such as the aforementioned Oxide 9500™ plasma etcher, the BPSG etch rate achieved during the BPSG etch step for a 200 mm wafer is greater than about 4,000 angstroms per minute. This etch rate is achieved using CO and $C_4F_8$ as selectivity enhancing chemicals (whose roles are believed to be polymer forming) at a flow rate of about 30 sccm for the CO and about 5 sccm for the $C_4F_8$. The Ne:$CHF_3$ flow ratio employed is about 10:1 with the Ne flow rate of about 200 sccm and a $CHF_3$ flow rate of about 20 sccm. The pressure maintained in the reactor chamber during the BPSG etch step is about 60 mTorr, and the power supplied to the lower electrode is about 1200 watts.

This particular etching regime advantageously results in a BPSG:$TiSi_2$ selectivity of greater than about 40:1, which represents a high and commercially advantageous BPSG:$TiSi_2$ selectivity. This etching regime also provides uniformity and etch rate loading of less than (+/−) 5 percent and a profile angle between 86 and 88 degrees, which all represent commercially desirable ranges.

Although the etchant source gas has been described as including Neon, $CHF_3$, and certain catalysts or polymer forming agents such as CO and $C_4F_8$, the etchant source gases may contain other inert components such as argon or helium and still remain within the scope of the present invention. As the term is used herein, "percent by volume" refers to the percent by volume of a particular gas to the gas composition that is fed to the reaction chamber. Furthermore, the etchant source gases of the present invention may contain catalysts or polymerizing components other than CO and $C_4F_8$, e.g., $CO_2$, $CH_2F_2$, or hydrofluorocarbons (HFC), e.g., SUVA™.

Table 1 summarizes the possible approximate process parameter ranges for etching an eight-inch wafer in a plasma reactor such as the Oxide 9500™ reactor. In the example of Table 1, the wafer includes a silicon substrate, a 2,000 Å polysilicon layer disposed thereon. Above the polysilicon layer, there is disposed a 600 Å $TiSi_2$ layer, which underlies a 5,000 Å thick BPSG layer (3.1% Boron, 4.1% Phosphorous). The photoresist layer that is employed to mask portions of the BPSG layer for etching is about 10,000 Å thick.

TABLE 1

|  | Suitable Range |  | Preferred Range |  | Preferred Value |  |
|---|---|---|---|---|---|---|
| Neon Flow Rate | 100–400 | sccm | 150–300 | sccm | 200 | sccm |
| CO Flow Rate | 15–60 | sccm | 22–45 | sccm | 30 | sccm |
| $C_4F_8$ Flow Rate | 2–10 | sccm | 3–8 | sccm | 5 | sccm |
| $CHF_3$ Flow Rate | 10–40 | sccm | 15–30 | sccm | 20 | sccm |
| Power | 800–1350 | watts | 1000–1300 | watts | 1200 | watts |
| Pressure | 20–90 | mTorr | 40–80 | mTorr | 60 | mTorr |

As indicated in Table 1, the neon gas flow rate may range from about 100 to about 400 sccm, more preferably about 150 to about 300 sccm, and even more preferably at about 200 sccm. The CO flow rate may range from about 15 to about 60 sccm, more preferably about 22 to about 45 sccm, and even more preferably at about 30 sccm. The $C_4F_8$ flow rate may range from about 2 to about 10 sccm, more preferably about 3 to about 8 sccm, and even more preferably at about 5 sccm. The $CHF_3$ flow rate may range from about 10 to about 40 sccm, more preferably about 15 to about 30 sccm, and even more preferably at about 20 sccm.

The power supplied to the lower electrode/chuck may range from about 800 to about 1350 watts, more preferably from about 1000 to about 1300 watts, and even more preferably at about 1200 watts. For this configuration, the reactor chamber pressure for the etch step may range from about 20 mTorr to about 90 mTorr, more preferably from about 40 mTorr to about 80 mTorr, and even more preferably at about 60 mTorr.

Additionally, the backside of the wafer may be cooled with helium having a pressure of about 12 Torr. In one embodiment, the bottom electrode may be maintained at a temperature of about 12° C., and the top electrode may be maintained at a temperature of about 20° C.

EXAMPLE

To further illustrate the advantages of the present invention, a sample etch is described in detail below. It should be borne in mind that the example given below is merely illustrative of one application of the inventive etch technique and should in no way be construed to limit the usefulness of the invention when applied to other wafers, layer stack structures, etching systems, and/or process parameters.

An eight-inch silicon wafer (200 mm in diameter) was used for this experiment. The wafer included a 10,000 Å photoresist layer, a 5,000 Å BPSG layer having 3.1% boron and 4.1% phosphorous, a 600 Å $TiSi_2$ layer, and a 2,000 Å polysilicon layer on a silicon substrate. The wafer in this experiment was processed in the aforementioned Oxide 9500™ reactor etching system. The reactor was equipped with a mechanical clamp type chuck for clamping the wafer to the bottom electrode. The reactor also utilized a turbo pump for maintaining the reactor at the desired pressure.

For this experiment, RF power at approximately 1200 watts was applied to the bottom electrode during the BPSG etch step. Also, helium cooling gas was applied to the bottom of the wafer at a pressure of about 12 Torr.

The etch step utilized an etchant source gas that includes neon at a flow rate of about 200 sccm, CO at a flow rate of about 30 sccm, $C_4F_8$ at a flow rate of about 5 sccm, and $CHF_3$ at a flow rate of about 20 sccm. The chamber pressure was maintained at about 60 mTorr throughout the BPSG etch step, which has a duration of approximately 250 seconds.

The approximate process results for this example of the inventive etch process are summarized as follows in Table 2:

TABLE 2

| Overall Etch Process | |
|---|---|
| BPSG Etch Rate | 4,243 Å/min |
| Uniformity | ±3.2% |
| BPSG:$TiSi_2$ Selectivity | greater than 75:1 for contacts smaller than 0.6 μm greater than 45:1 for contacts larger than 0.6 μm |
| Etch rate loading | less than 10% |
| Profile Angle | 86–88 degrees |

As shown in Table 2, the inventive BPSG etch process achieves a commercially advantageous etch rate of about 4,243 Å with a high BPSG:$TiSi_2$ selectivity (greater than about 75 to 1 for contacts smaller than 0.6 μm and about 45 to 1 for contacts larger than 0.6 μm). The uniformity is measured to be about +/−3.2% using the aforementioned method for determining uniformity, the etch rate loading is measured to be less than 10%, and the profile angles were measured to be between about 86 and about 88 degrees.

While this invention has been described in terms of several preferred embodiments, there are alterations, permutations, and equivalents which fall within the scope of this invention. It should also be noted that there are many alternative ways of implementing the methods of the present invention. It is therefore intended that the following appended claims be interpreted as including all such alterations, permutations, and equivalents as fall within the true spirit and scope of the present invention.

What is claimed is:

1. A method for providing a high Borophosphosilicate Glass (BPSG) to Titanium Silicide ($TiSi_2$) selectivity while etching substantially through a selected portion of a BPSG layer of a silicon wafer layer stack to a $TiSi_2$ layer of the wafer's layer stack in a plasma processing chamber, the method comprising:

etching substantially through the selected portion of the BPSG layer of the layer stack using an etchant source gas that comprises Ne, $CHF_3$, $C_1F_8$, and an additional chemical, said additional chemical being selected from the group consisting of CO, $CO_2$, $CH_2F_2$, and hydrofluorocarbon.

2. The method of claim 1 wherein the additional chemical includes CO.

3. The method of claim 2 wherein the CO: $C_4F_8$ flow ratio is about 6:1.

4. The method of claim 2 wherein a chamber pressure within the plasma processing chamber during the etching step ranges from about 20 mTorr to about 90 mtorr.

5. The method of claim 2 wherein the etchant source gas in the plasma processing chamber is energized to form a plasma using an inductively coupled RF source.

6. The method of claim 5 wherein the plasma processing chamber includes a lower electrode for energizing the plasma, the power supplied to the lower electrode during the etching step ranges from about 800 watts to about 1350 watts.

7. The method of claim 2 wherein a flow rate for the $CHF_3$ ranges from about 10 standard cubic centimeters per minute (sccm) to about 40 sccm.

8. The method of claim 7 wherein a Ne:$CHF_3$ flow ratio is about 10:1.

9. The method of claim 2 wherein a CO:$CHF_3$ flow ratio is about 3:2.

10. A method for plasma etching substantially through a selected portion of a Borophosphosilicate Glass (BPSG) layer of a silicon wafer layer stack to a Titanium Silicide ($TiSi_2$) layer of the wafer's layer stack, the method comprising:

etching substantially through the selected portions of the BPSG layer of the layer stack with an etchant source gas that comprises Ne, $CHF_3$, CO, and $C_4F_8$.

11. The method of claim 10 wherein a CO:$CHF_3$ flow ratio is about 3:2.

12. The method of claim 10 wherein a CO:$C_4F_8$ flow ratio is about 6:1.

13. The method of claim 10 wherein a flow rate for the $CHF_3$ ranges from about 10 standard cubic centimeters per minute (sccm) to about 40 sccm.

14. The method of claim 10 wherein a Ne:$CHF_3$ flow ratio is about 10:1.

15. A method of etching a contact opening during the manufacturing of an integrated circuit having components formed on a semiconductor wafer die, said die having thereon etched layers of a layer stack and said contact opening being formed through a BPSG layer of the layer stack which is disposed above a $TiSi_2$ layer, said method comprising:

etching said contact opening substantially through a selected portion of the BPSG layer to the $TiSi_2$ layer of the layer stack with an etchant source gas that comprises Ne, $CHF_3$, CO, and $C_4F_8$.

16. The method of claim 15 wherein a flow rate for the $CHF_3$ ranges from about 10 standard cubic centimeters per minute (sccm) to about 40 sccm and wherein a Ne:$CHF_3$ flow ratio is about 10:1.

17. The method of claim 15 wherein the etching step is performed with a pressure within the plasma processing chamber of about 20 mTorr to about 90 mTorr.

* * * * *